(12) United States Patent
Hao (10) Patent No.: US 8,269,277 B2
(45) Date of Patent: Sep. 18, 2012

(54) RESURF DEVICE INCLUDING INCREASED BREAKDOWN VOLTAGE

(75) Inventor: Jifa Hao, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 106 days.

(21) Appl. No.: 12/854,391

(22) Filed: Aug. 11, 2010

(65) Prior Publication Data

US 2012/0037988 A1    Feb. 16, 2012

(51) Int. Cl.
    *H01L 29/76* (2006.01)
(52) U.S. Cl. ........ 257/343; 257/327; 257/341; 257/349; 257/E29.253
(58) Field of Classification Search .................. 257/327, 257/341, 343, 349
See application file for complete search history.

(56) References Cited

U.S. PATENT DOCUMENTS

| | | | |
|---|---|---|---|
| 4,672,738 A | 6/1987 | Stengl et al. | |
| 5,898,201 A * | 4/1999 | Hsu et al. | 257/409 |
| 6,492,679 B1 | 12/2002 | Imam et al. | |
| 6,873,011 B1 * | 3/2005 | Huang et al. | 257/345 |
| 6,979,875 B2 | 12/2005 | Kwon et al. | |
| 7,626,233 B2 | 12/2009 | Tornblad et al. | |
| 7,999,315 B2 | 8/2011 | Cai | |
| 2005/0139858 A1 | 6/2005 | Sung | |
| 2007/0090451 A1 | 4/2007 | Lee | |
| 2009/0230468 A1 | 9/2009 | Cai | |
| 2009/0253234 A1 | 10/2009 | Lee | |
| 2010/0084686 A1 | 4/2010 | Cai et al. | |
| 2010/0140700 A1 * | 6/2010 | Lee | 257/343 |
| 2010/0155830 A1 | 6/2010 | Takahashi | |
| 2010/0219471 A1 | 9/2010 | Cai | |

OTHER PUBLICATIONS

"U.S. Appl. No. 12/395,817, Non Final Office Action mailed Dec. 27, 2010", 9 pgs.
"U.S. Appl. No. 12/395,817, Notice of Allowance mailed Apr. 11, 2011", 7 pgs.
"U.S. Appl. No. 12/395,817, Response filed Mar. 28, 2011 to Non Final Office Action mailed Dec. 27, 2010", 12 pgs.
Hower, P.L., et al., "Snapback and Safe Operating Area of Ldmos Transistors", IEEE, (1999), 4 pgs.
Ma, Yutao, et al., "Introduction to Cadence LDMOS Model", Cadence [ppt], (Dec. 2005), 18 pgs.
Pan, Robert, et al., "High Voltage (up to 20V) Devices Implementation in 0.13 um BiCMOS Process Technology for System-On-Chip (SOC) Design", IEEE, Proceedings of the 18th International Symposium on Power Semiconductor Devices & IC's, Jun. 4-8, 2006 Naples, Italy, (2006), 4 pgs.

(Continued)

*Primary Examiner* — Wai Sing Louie
(74) *Attorney, Agent, or Firm* — Schwegman, Lundberg & Woessner, P.A.

(57) ABSTRACT

A semiconductor device can include a source region near a working top surface of a semiconductor region. The device can also include a gate located above the working top surface and located laterally between the source and a drain region. The source region and the gate can at least partially laterally overlap a body region near the working top surface. The source region can include a first portion having the first conductivity type, a second portion having a second conductivity type, and a third portion having the second conductivity type. The second portion can be located laterally between the first and third portions and can penetrate into the semiconductor region to a greater depth than the third portion but no more than the first portion. The lateral location of the third portion can be determined at least in part using the lateral location of the gate.

20 Claims, 6 Drawing Sheets

OTHER PUBLICATIONS

Pritiskutch, John, et al., "Understanding LDMOS Device Fundamentals", Application Note AN1226, (Jul. 2000), 4 pgs.

Riccardi, Damiano, et al., "BCD8 from 7V to 70V: a new 0.18um Technology Platform to Address the Evolution of Applications towards Smart Power ICs with High Logic Contents", IEEE, Proceedings of the 19th International Symposium on Power Semiconductor Devices & ICs, May 27-30, 2007, Jeju, Korea, (2007), pp. 73-76.

Tsai, Chin-Yu, et al., "16-60V Rated LDMOS Show Advanced Performance in an 0.72um Evolution BiCMOS Power Technology", IEEE, (1997), pp. 367-370.

Vestling, L., et al., "Drift region optimization of lateral RESURF devices", Solid-State Electronics, 46(8), (Aug. 2002), 1177-1184.

* cited by examiner

RESURF DEVICE INCLUDING INCREASED BREAKDOWN VOLTAGE

BACKGROUND

Metal-oxide-semiconductor field-effect transistors (MOSFETs) can be used to amplify or switch electrical or electronic signals. MOSFETs have almost entirely displaced various other switching and amplification devices due to their low unit cost and ease of fabrication, particularly for digital switching applications. A MOSFET can include a metal or polycrystalline silicon (polysilicon) gate separated from a semiconductor region by an insulator, so the term "MOSFET" can refer generally to a FET including a metallic or a non-metallic gate material. The semiconductor region generally includes a substrate of a first conductivity type, and a source region and drain region of a second different conductivity type located on either side of the semiconductor region, under the insulator.

MOSFET devices can be categorized as n-channel or p-channel devices, and as enhancement-mode or depletion-mode devices. The enhancement-mode MOSFET includes a drain region and a source region isolated by the substrate. In the enhancement MOSFET, as voltage is applied to the gate, a channel forms in the semiconductor region between the drain and the source, allowing current to flow between the source and the drain.

In contrast, the depletion-mode MOSFET includes a coupled source and drain region extending below the gate. Here, as voltage is applied to the gate, a depletion region forms under the insulator, narrowing the coupled region between the source and the drain, the narrowed region reducing the ability for current to flow between the source and the drain.

The terms "n-channel" and "p-channel" refer to the type of charge carrier providing conduction between the source and drain regions. An "n-channel" or "NMOS" device uses majority conduction via electrons when the device is biased into conduction. Similarly, "p-channel" or "PMOS" refer to conduction via the migration of "holes." Unlike bipolar junction transistors (BJTs), MOSFETs use majority carriers primarily.

Different types of MOSFET devices can be co-integrated on a single monolithic substrate, such as by fabricating one or more wells of a first conductivity type (e.g., n type) within a substrate of the opposite conductivity type (e.g., p type). Such integrated combinations are called complimentary metal-oxide-semiconductor (CMOS) integrated circuits.

CMOS integrated circuits can be planar, including processing primarily involving one surface of a substrate or wafer. Such planar processing can include, for example, ion implantation, diffusion, deposition, oxidation, epitaxy, one or more photolithographic techniques, or one or more other process steps. Multiple MOSFETs, among other devices such as MOS capacitors or resistors, can be fabricated and interconnected on a single monolithic substrate. Such integrated assemblies can include anywhere from a handful of devices to beyond hundreds of millions of individual devices.

OVERVIEW

In an example, a combination of relatively lower power circuitry (e.g., digital logic) and relatively higher power circuitry (e.g., analog switching, amplification, or signal conditioning, or the like) can be co-integrated on or within a commonly-shared semiconductor substrate. For example, a semiconductor integrated circuit can include a combination of one or more laterally-conducting semiconductor devices, such as using carrier mobility primarily parallel to a long axis of the device (e.g., parallel to a working surface).

Example 1 comprises an apparatus or system, such as including a semiconductor device comprising a source region near a working surface of a semiconductor region, a drain region near the working surface and laterally offset from the source region, a gate located above the working surface and located laterally between the source and drain regions, a well region extending from the drain region laterally towards the source region, and comprising at least a portion of the active region of the semiconductor device when the semiconductor device is biased into a conducting mode, a top diffusion region near the working surface within the well region and comprising a center portion located laterally between the source and drain regions, a drain-facing portion located adjacent to the center portion on a lateral edge of the center portion facing the drain region, a source-facing portion located adjacent to the center portion on a lateral edge of the center portion facing the source region, the center portion laterally wider than the source- and drain-facing portions. In Example 1, the semiconductor region and top diffusion regions can include a first conductivity type, and the source, drain and well regions can include a second conductivity type.

In Example 2, the subject matter of Example 1 can optionally include a respective doping profiles of the central-, drain-, and source-facing portions of the top diffusion region determined at least in part using a dopant implanted through separate respective apertures included in a mask, the mask including a central aperture aligned above a location corresponding to the center portion of the top diffusion region.

In Example 3, the subject matter of one or any combination of Examples 1-2 can optionally include respective apertures in the mask comprising a first side aperture aligned above a location corresponding to the drain-facing portion of the top diffusion region and a second side aperture aligned above a location corresponding to the source-facing portion of the top diffusion region.

In Example 4, the subject matter of one or any combination of Examples 1-3 can optionally include a central aperture laterally wider than the first and second side apertures.

In Example 5, the subject matter of one or any combination of Examples 1-4 can optionally include respective apertures in the mask comprising a first group of side apertures above a location corresponding to a first controllably tapered profile of the top diffusion region on the lateral edge facing the drain region, and a second group of side apertures above a location corresponding to a second controllably tapered profile of the top diffusion region on the lateral edge facing the source region.

In Example 6, the subject matter of one or any combination of Examples 1-5 can optionally include uniform spacing between each of the side apertures in each of the first and second groups.

In Example 7, the subject matter of one or any combination of Examples 1-6 can optionally include uniform lateral widths of each of the side apertures included in the first and second groups of side apertures, and the central aperture is laterally wider than each of the side apertures.

In Example 8, the subject matter of one or any combination of Examples 1-7 can optionally include a lateral width of a respective side aperture determined at least in part by the lateral distance between the respective side aperture and the central aperture.

In Example 9, the subject matter of one or any combination of Examples 1-8 can optionally include a decreasing lateral width of a respective side aperture as the lateral distance between the respective side aperture and the central aperture increases.

In Example 10, the subject matter of one or any combination of Examples 1-9 can optionally include a spacing between respective adjacent apertures determined at least in part by the lateral distance between the respective adjacent apertures and the central aperture.

In Example 11, the subject matter of one or any combination of Examples 1-10 can optionally include an increasing spacing between respective adjacent apertures as the lateral distance between the respective adjacent apertures and the central aperture increases.

In Example 12, the subject matter of one or any combination of Examples 1-11 can optionally include a first conductivity type comprising a p type conductivity, and the second conductivity type comprising an n type conductivity.

In Example 13, the subject matter of one or any combination of Examples 1-12 can optionally include a top diffusion dopant comprising boron.

In Example 14, the subject matter of one or any combination of Examples 1-13 can optionally include a top diffusion region more highly doped than the semiconductor region, the source region includes a tap region penetrating away from the working surface to a depth greater than one or more other diffusion regions comprising the source region.

In Example 15, the subject matter of one or any combination of Examples 1-14 can optionally include a tap region comprising a doping profile having a first peak doping concentration, the semiconductor region includes a doping profile having a second peak doping concentration, and the first peak doping concentration is higher than the second peak doping concentration.

In Example 16, the subject matter of one or any combination of Examples 1-15 can optionally include a drain region comprising a doping profile having a first peak doping concentration, the well region includes a doping profile having a second peak doping concentration, and the first peak doping concentration is higher than the second peak doping concentration.

In Example 17, the subject matter of one or any combination of Examples 1-16 can optionally include a semiconductor region comprising a semiconductor substrate.

In Example 18, the subject matter of one or any combination of Examples 1-17 can optionally include a conductive material coupled to drain region near the working surface, the conductive material extending lateral toward the gate and source regions and electrically insulated from the semiconductor region elsewhere.

Example 19 can include, or can optionally be combined with subject matter of one or any combination of Examples 1-18 to include, subject matter (such as a method, a means for performing acts, or a machine-readable medium including instructions that, when performed by the machine, cause the machine to perform acts) comprising providing a source region near a working surface of a semiconductor region, providing a drain region near the working surface and laterally offset from the source region, providing a gate located above the working surface and located laterally between the source and drain regions, providing a well region extending from the drain region laterally towards the source region, the well region comprising at least a portion of the active region of the semiconductor device when the semiconductor device is biased into a conducting mode, providing a top diffusion region near the working surface within the well region. In Example 19, the top diffusion region comprises a center portion located laterally between the source and drain regions, a drain-facing portion located adjacent to the center portion on a lateral edge of the center portion facing the drain region, and a source-facing portion located adjacent to the center portion on a lateral edge of the center portion facing the source region.

In Example 19, respective doping profiles of the central-, drain-, and source-facing portions of the diffusion region are determined at least in part using a dopant implanted through separate respective apertures included in a mask, the center portion laterally wider than the source- and drain-facing portions, and the semiconductor region and top diffusion regions include a first conductivity type, and the source, drain and well regions include a second conductivity type.

Example 20 comprises an apparatus or system that can include, or can optionally be combined with the subject matter of one or any combination of Examples 1-19, subject matter comprising a semiconductor device including a source region near a working surface of a semiconductor region, a drain region near the working surface and laterally offset from the source region, a gate located above the working surface and located laterally between the source and drain regions, a well region extending from the drain region laterally towards the source region, the well region comprising at least a portion of the active region of the semiconductor device when the semiconductor device is biased into a conducting mode, a top diffusion region near the working surface within the well region and comprising a center portion located laterally between the source and drain regions, a drain-facing portion located adjacent to the center portion on a lateral edge of the center portion facing the drain region, a source-facing portion located adjacent to the center portion on a lateral edge of the center portion facing the source region, where respective doping profiles of the central-, drain-, and source-facing portions of the diffusion region are determined at least in part using a dopant implanted through separate respective apertures included in a mask, the center portion laterally wider than the source- and drain-facing portions, and where the semiconductor region and top diffusion regions include a first conductivity type, and the source, drain and well regions include a second conductivity type.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

MOSFETs can be used in a variety of consumer and industrial applications, such as for switching applications. Power MOSFET devices can be fabricated using processes similar to those used for very large scale integration (VLSI) devices, such as including CMOS integrated circuits. A power MOSFET can include a laterally separated source, gate, and drain. In certain examples, a lateral power MOSFET can operate using primarily a lateral mode of conduction between the source and drain. In certain examples, the lateral conduction can be nearly parallel to a specified surface of a semiconductor substrate, such as a top working surface. Power MOSFETs, such as including the lateral configuration, can be fabricated using processing similar to low-power digital CMOS VLSI device processing, or one or more other processes.

In an example, one or more power MOSFETs can be co-integrated with one or more high speed or low power digital CMOS devices. In certain examples, the one or more co-integrated power MOSFETs and the one or more digital devices can be included as a portion of a mixed-signal system including digital, power or analog blocks. In an example, the mixed-signal system can be fabricated on a single monolithic substrate, such as using processing techniques similar to planar CMOS processing.

A manufacturing process for a lateral MOSFET semiconductor device can include one or more deposition, implant, or diffusion steps, among one or more other steps. In certain examples, one or more donor or acceptor impurities can be introduced into a semiconductor substrate via ion implantation at a specified energy level, dose (e.g., a specified ion concentration), or angle. In certain examples, such as after one or more ion implantation steps, impurities can be thermally diffused to penetrate into specified locations and to achieve a desired impurity profile, or "doping profile," within the semiconductor device.

In certain examples, a source region and a body region of a lateral MOSFET can be fabricated using a common mask or a common alignment feature, such as during one or more successive implant or thermal diffusion steps. When two or more regions are formed using successive self-aligned thermal diffusion steps such as using one or more common masks or alignment features, the lateral MOSFET semiconductor device is called a Lateral Diffused Metal Oxide Semiconductor (LDMOS) device.

The present inventor has recognized, among other things, that an extended drift region can be included in an LDMOS device, such as to reduce a surface electric field to provide a reduced surface electric field (RESURF) LDMOS device. The present inventor has also recognized that a shape or configuration of a top diffusion region included in the extended drift region can be used to reduce a lateral electric field intensity within a semiconductor material, and near the surface, as well as to provide charge-balancing. Such a shaped top diffusion region can increase breakdown voltage or reduce an on-state resistance of the device, as compared to a device lacking a shaped top diffusion region.

Figure 1:
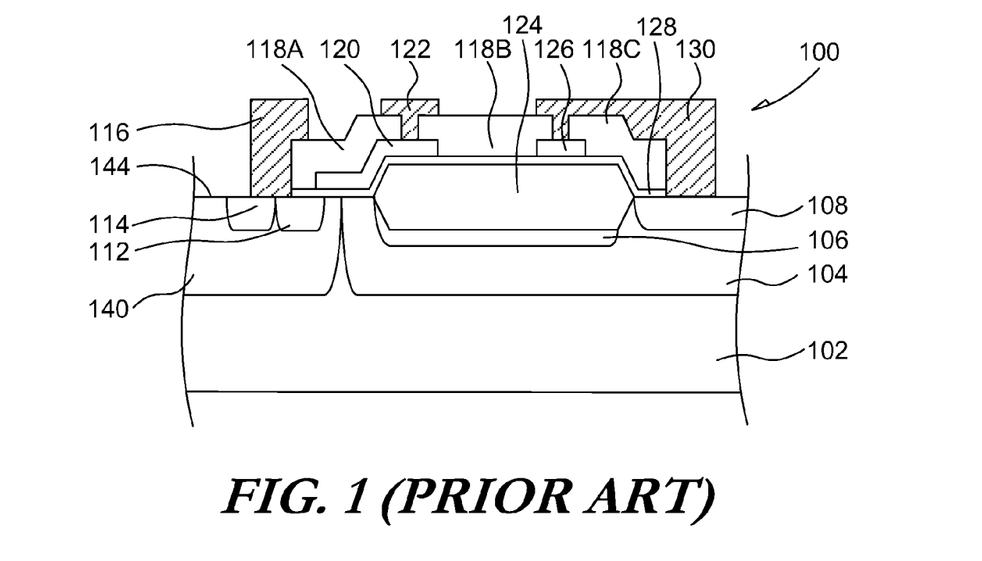
FIG. 1 illustrates generally an example of a prior art Lateral Diffused Metal Oxide Semiconductor (LDMOS) device, including a top diffusion layer within a well region, the diffusion layer located laterally between a source and a drain region.

FIG. 1 illustrates generally an example of a prior art n-channel (NMOS) RESURF LDMOS device 100, including a p type top diffusion layer (p-top layer) 106 within a n type well region 104, the top diffusion layer 106 located laterally between an n type source region 112 and an n type drain region 108. In the prior art example of FIG. 1, the device 100 includes a p type region 114 (e.g., a body region), along with the source region 112, within a p type well region 140. The device 100 includes a source electrode 116, a gate electrode 122 coupled to a gate region 105, and a drain electrode 130 coupled to a drain plate 126 and the drain region 108. A combination of the drain plate 126 and n-well region 104 can alter the electrical field distribution between the source and drain regions. For example, the n-well region 104 extending laterally toward the source from the drain region (e.g., in a drift region) can help concentrate the electric field gradient below a surface 144 of the device 100, and the p-top layer 106 can provide charge balancing.

Figure 2:
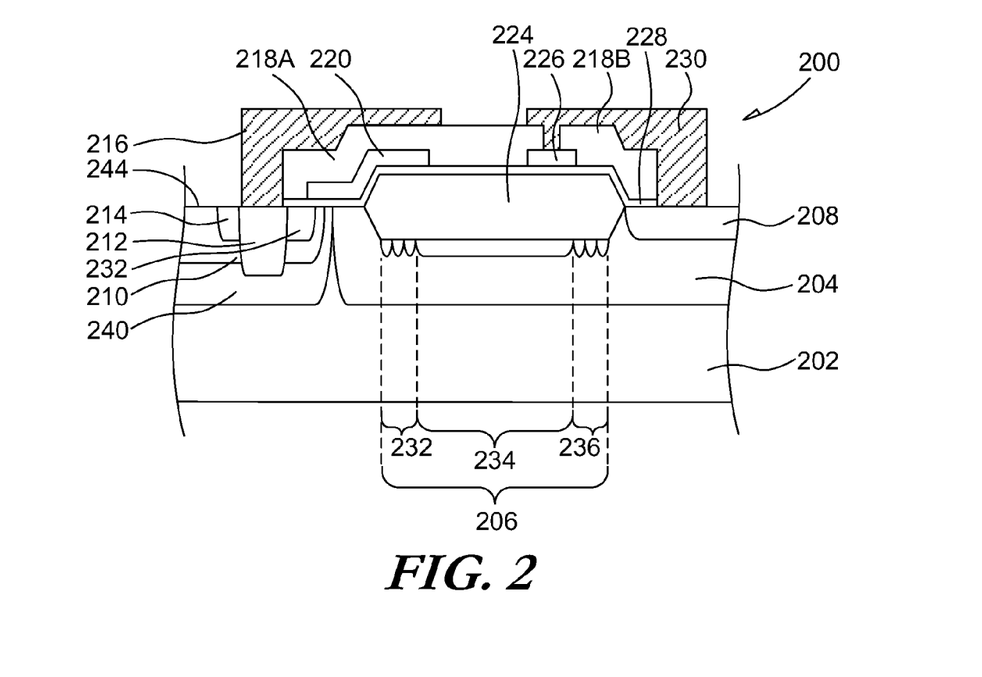
FIG. 2 illustrates generally an example of a semiconductor device that can include a top diffusion region having a center portion, a source-facing portion, or a drain-facing portion.

FIG. 2 illustrates generally an example of a RESURF LDMOS semiconductor device 200 that can include a top diffusion region 206 having a center portion 234, a source-facing portion 232, or a drain-facing portion 236, such as driven in or diffused into a semiconductor region 202 from a working surface 244. In an example, the semiconductor region 202 can include a lightly-doped p type substrate (e.g., including silicon), or a layer of semiconductor material grown or otherwise attached to one or more other substrate materials. The device 200 can include a lightly-doped n-well region (or n type epitaxial layer) 204, such as including a more heavily-doped n type drain region 208. The device 200 can include a lightly-doped p-well region 240, such as to provide a specified gate threshold voltage, among other things. The p-well 240 can contain a lightly-doped p type body region 210 and a more heavily-doped n type source region 232. The device 200 can include a more heavily-doped p type diffusion region 214, and a more heavily-doped p type tap region 212, such as to reduce a likelihood of punch-through or unwanted parasitic bipolar junction transistor (BJT) behavior.

The device 200 can include a source metallization (e.g., a source electrode) 216, a polysilicon or metal gate region 220 (or including one or more other conductive materials), or a drain electrode 230, such as connected to a drain flap 226 (e.g., including a polysilicon region, a metal region, or one or more other materials). The source electrode 216 can be physically or electrically isolated from the gate region 220, such as using an inter-layer dielectric (ILD) material 218A. Similarly, the drain region can be physically or electrically isolated from one or more other regions using an ILD material 218B. In an example, the gate region 220 can be located above an insulating layer 228, such as a gate region 220 located at least in part above a field oxide layer 224. In an example, the source-facing portion 232 of the top diffusion 206 can be located at or near the "bird's beak" of the field oxide layer 224.

The present inventor has also recognized that an off-state breakdown voltage (e.g., BVdss), such as between the source electrode 216 and the drain electrode 230, can be enhanced by reducing an electric field magnitude or gradient near the working surface 244 of the device, and in the lateral regions of the top diffusion layer 206, such as in the source-facing portion 232, or in the drain facing portion 236. In contrast to the example of FIG. 1, the example of FIG. 2 can include a top diffusion region having a specified profile, such as provided by ion implantation through a group of apertures included in mask, as shown in the examples of FIGS. 3A-3C or FIG. 4. Such a specified profile can include a scalloped, ribbed, or tapered appearance, such as including a lateral profile as shown in the example of FIG. 2, such as to reduce the peak electric field at one or more lateral edges of the top diffusion region 206, where the region terminates into the well region 204.

A tradeoff can exist between a drain-to-source off-state breakdown voltage (e.g., BVdss) and an on-state resistance (e.g., $R_{DSon}$). For example, in a RESURF device, such as the example of FIG. 2, the extended drift region provided by the well 204 can provide a higher BVdss than a device lacking such a drift region, at the expense of increasing $R_{DSon}$. In such a RESURF device 200, the top diffusion region 206 can be included, such as to provide a charge-balanced condition (e.g., balancing the charge of the n-well region 204) to reduce $R_{DSon}$ when the device 200 is biased into conduction. However, the size and shape of the top diffusion region can also affect BVdss. Also, if the peak doping concentration within the region 206 is too high or too low, BVdss can decrease. For example, if the total charge associated with the top diffusion region 206 exceeds the magnitude of the corresponding charge associated with the n-well region 204, BVdss can decrease. The present inventor has recognized, among other things, that modifying the profile (e.g., a size or shape) of the top diffusion region 206 can improve (e.g., increase) BVdss while $R_{DSon}$ remains unchanged or even decreases, for a device having a specified channel length, such as according to the simulation results of the illustrative examples of FIGS. 5-7. It is believed that such an improvement in BVdss can be due, at least in part, to improved charge-balancing provided by the more easily-controlled doping profile provide by the top diffusion 206.

Also, the top diffusion 206 can provide a reduction in hot carrier degradation effects when a peak or gradient of the lateral electric field is reduced or minimized on either the source- or drain-facing portions of the top diffusion region 206 such as using a top diffusion 206 having a specified profile (e.g., a doping profile having a specified size, shape, or peak concentration), versus the example of FIG. 1. Such an improvement in hot carrier degradation can also improve the stability of BVdss over time or over a range of operating conditions, and can prevent or reduce an increase in $R_{DSon}$ during on-state operation. The present inventor has also recognized that the doping concentration of the top diffusion 206 need not be as carefully controlled during processing or fabrication as the corresponding region 106 in FIG. 1, since the top diffusion 206 may become more easily and completely depleted during operation of the device 200. It is believed that such enhanced depletion may be related at least in part to the more complex surface geometry (e.g., a greater surface-to-volume ratio) of the diffusion region 206 within the device 200, as compared to the example of FIG. 1.

In an example, the drain flap 226 can also help to concentrate an electric field gradient between the drain, gate, or source regions within the semiconductor region 202, since such a semiconductor material can have a higher dielectric breakdown voltage than the region above the working surface 244.

Figure 3A:
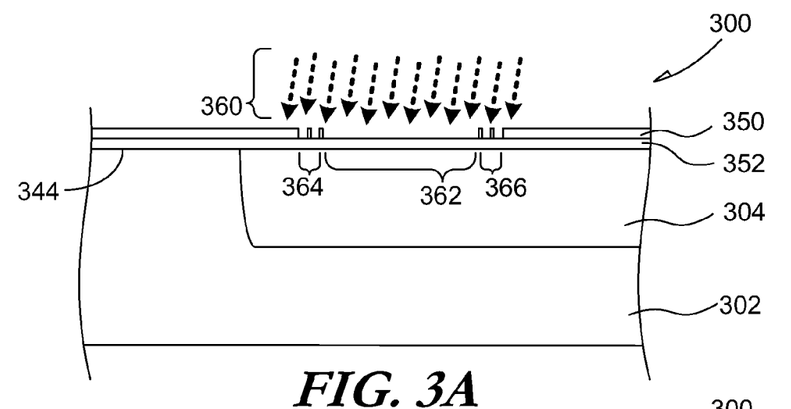
FIGS. 3A-C illustrate generally a technique that can including forming a top diffusion region such as shown in the example of FIG. 2.
Figure 3B:
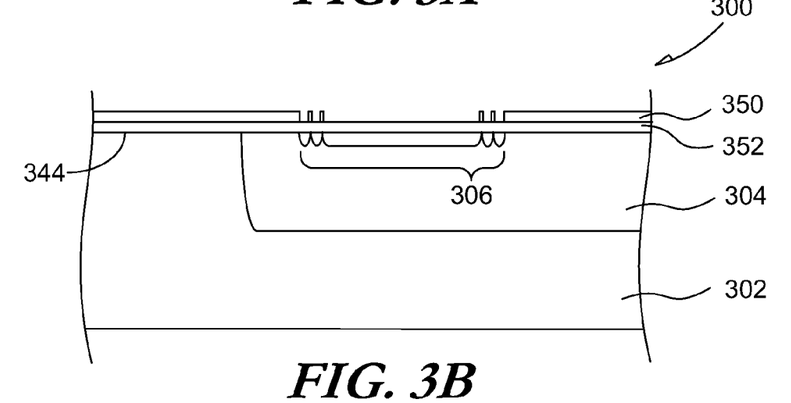
Figure 3C:
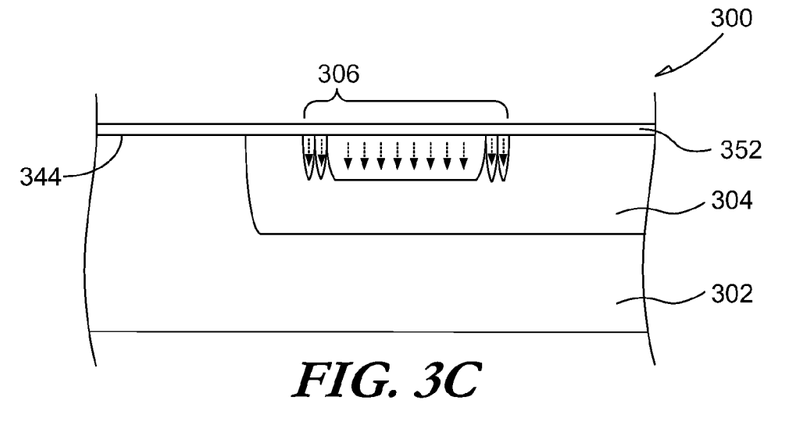

FIGS. 3A-C illustrate generally a technique that can including forming a top diffusion region 306, such as shown in the example of FIG. 2. In FIGS. 3A-C a semiconductor device 300 can include a semiconductor region 302 (e.g., a semiconductor substrate). In an example, a mask 350 (e.g., a photoresist) can be patterned onto the semiconductor region 302 (e.g., a p type semiconductor region), such as onto an oxide layer 352 formed on a working surface 344 of the device 300. For example, the oxide layer 352 can provide some protection against damage to the device 300 during processing, and can be around 500-600 Angstroms thick (or including one or more other thicknesses or materials). In an example, the mask 350 can include a large central aperture 362, a source-facing aperture group 364, or a drain-facing aperture group 366, such apertures including one or more rings, slots, rectangles or other shaped apertures. In the example FIG. 3A, the source-facing group 364 and drain-facing group 366 each include two respective apertures. In an example, the number of respective apertures in either the source- or drain-facing groups 364, 366 can be from two to five apertures, such as depending on the lateral length of the drift region (e.g., determined at least in part by an n type well region 304 length). In an example, another number of apertures can be used. In an example, the number of respective apertures in the source- or drain-facing groups 364, 366 can be determined at least in part by the specified depth of a p type top diffusion layer (e.g., p-top) to be implanted through the mask 350.

In an example, the spacing between adjacent apertures or individual aperture widths in one or more of the source- or drain-facing groups 364, 366 can be determined at least part by the lateral distance between the aperture and the central aperture 362. In an example, the lateral width of an aperture included in one or more of the source- or drain-facing groups 364, 366 can be determined at least in part by a lateral distance between the aperture and the central aperture 362. For example, an aperture (e.g., included in one or more of groups 364, 366) located at a lateral distance further away from the central aperture 362 can be narrower than an aperture located more closely to the central aperture 362. In an example, a separation between adjacent apertures located at a lateral distance further away from the central aperture 362 can be wider than a separation between adjacent apertures located more closely to the central aperture 362 (e.g., a separation between adjacent apertures can increase as a lateral distance away from the central aperture 362 increases).

In FIG. 3A, high-energy ions 360 can be implanted into the device 300, such as through the mask 350, to provide a desired concentration of impurity ions within specified portions of the device 300, such as within the well region 304 (e.g., a drift region of a field-effect transistor (FET) device, such as shown in FIG. 2).

In FIG. 3B, one or more of an implant dose, an implant energy, or an implant angle of the high-energy ions 360 shown in FIG. 3A can be specified to provide a specified impurity or doping profile (e.g., a specified doping concentration with respect to lateral position or depth) of the top diffusion region 306 within the device 300.

In FIG. 3C, a "drive in" or thermal diffusion technique (e.g., a thermal annealing) can be used to cause the top diffusion 306 to penetrate further into the well region 304 (or one or more other regions), and somewhat laterally away from the initial implant sites below one or more mask apertures, such as away from the working surface 344. A combination of the implant technique of FIG. 3A and the thermal diffusion step of FIG. 3C can be used to provide a specified charge concentration within the top diffusion region 306. In an illustrative example, the top diffusion region 306 can include a p type dopant (e.g., boron), implanted at a dose concentration of around $4.8 \times 10^{12}$ atoms/cm$^2$, such as implanted using an around 150 kilo-electronvolt (keV) energy level. For example, FIG. 5 includes an illustrative example showing a plot simulating an effect of top diffusion region 306 charge concentration on a drain-to-source off-state breakdown voltage (BVdss).

Figure 4:
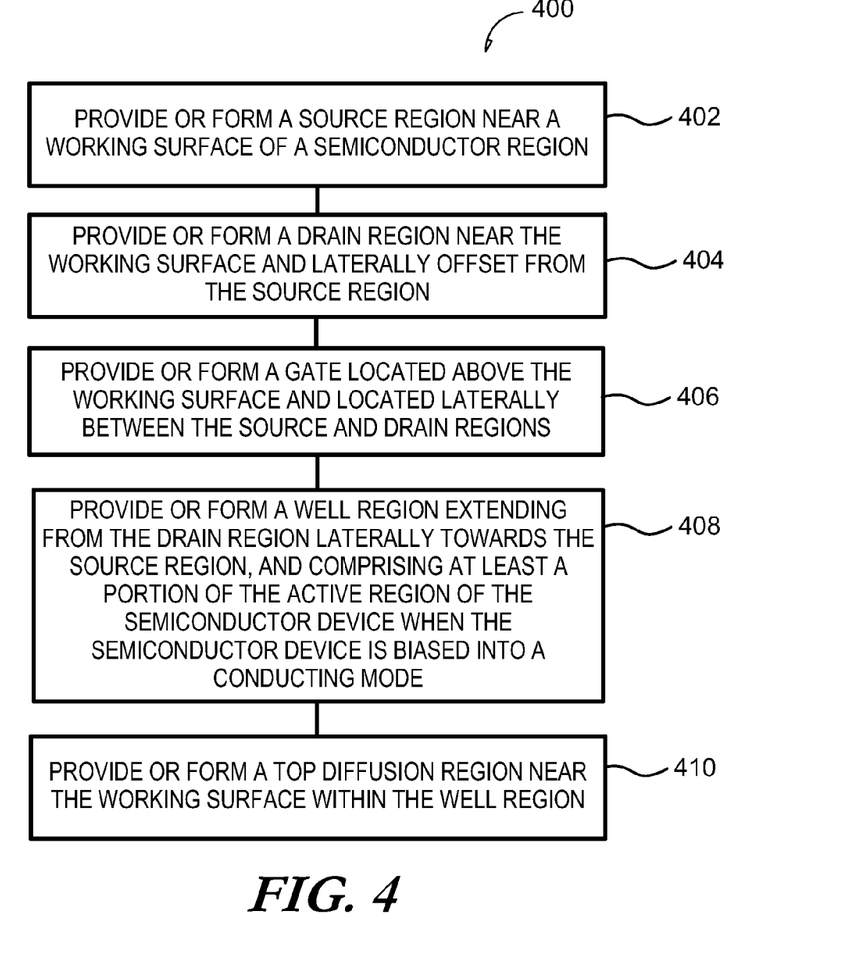
FIG. 4 illustrates generally a technique that can include forming a semiconductor device such as shown in the example of FIG. 2.

FIG. 4 illustrates generally a technique 400 that can include providing, forming or otherwise fabricating a semiconductor device such as shown in the example of FIG. 2. In an example, at 402, the technique 400 can include providing or forming a source region near a working surface of a semiconductor region. At 404, the technique 400 can include providing or forming a drain region near the working surface and laterally offset from the source region. At 406, the technique 400 can include providing or forming a gate located above the working surface and located laterally between the source and drain regions. At 408, the technique 400 can include providing or forming a well region extending from the drain region laterally towards the source region, and comprising at least a portion of the active region of the semiconductor device when the semiconductor device is biased into a conducting mode of operation (e.g., an "on" state). At 410, the technique 400 can include providing or forming a top diffusion region near the working surface within the well region, such as shown in the examples of FIG. 2, and FIGS. 3A-C.

Simulation Results for an Illustrative Example

Figure 5:
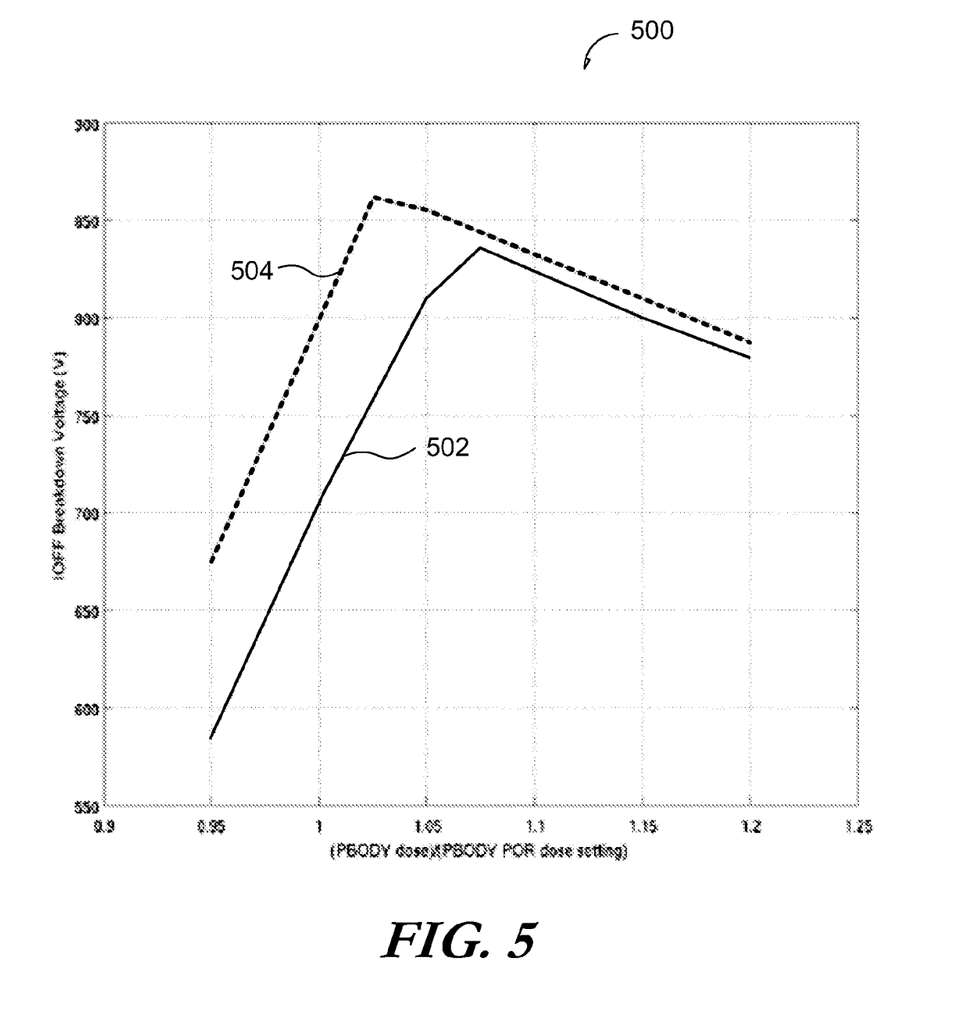
FIG. 5 includes a plot of an illustrative example of a breakdown voltage simulated for a semiconductor device such as shown in the example of FIG. 2, as compared to a semiconductor device having a top diffusion region similar to the example of FIG. 1.

FIG. 5 includes a plot of an illustrative example 500 of a breakdown voltage 504 simulated for a semiconductor device 200 such as shown in the example of FIG. 2 as compared to a breakdown voltage 502 simulated for a semiconductor device having a top diffusion region similar to the example of FIG. 1. In FIG. 5, the vertical axis includes a breakdown voltage (in volts), and the horizontal axis includes a doping concentration corresponding to the peak doping concentration of a top diffusion region (e.g., a p-top region) included in the semiconductor device, scaled relative to a "process of record" (POR). In the illustrative example of FIG. 5, the POR implant concentration dose can be around $4.8 \times 10^{12}$ atoms/cm$^2$. The illustrative example of FIG. 5 shows both a dependence of breakdown voltage on doping concentration and on the size or shape of the doping profile, with the breakdown voltage 504 showing a consistent improvement (e.g., an increase) in off-state breakdown voltage over a range of doping concentrations as compared to a device lacking the modified top diffusion profile.

Figure 6:
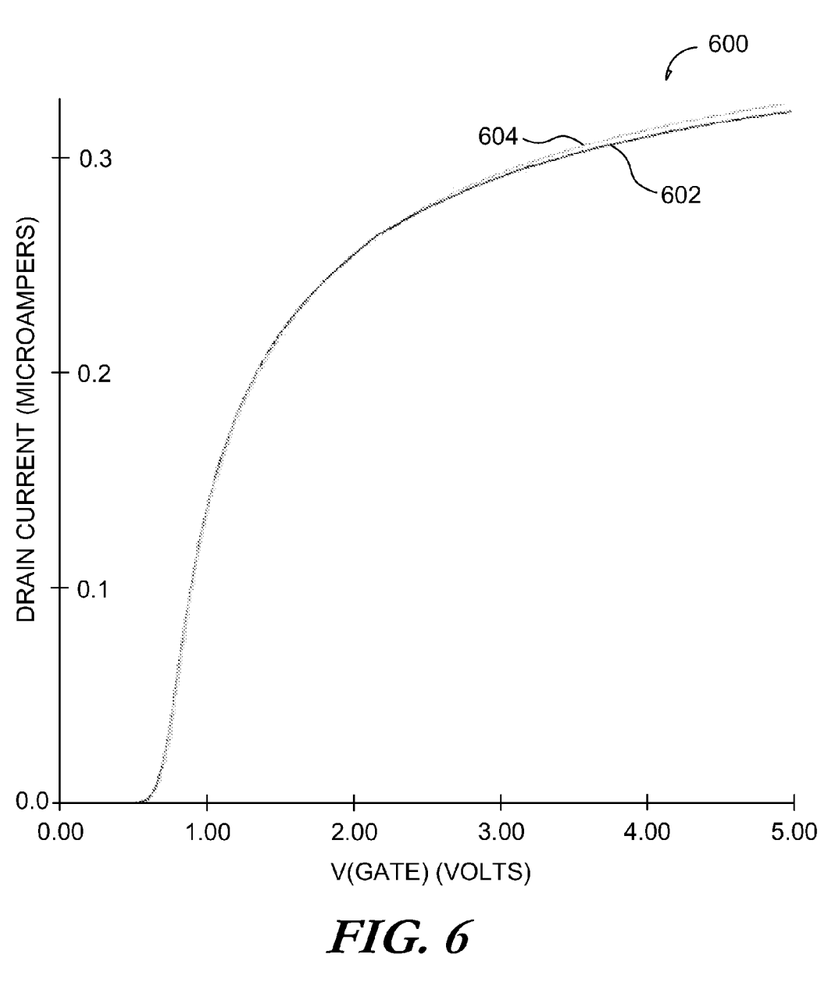
FIG. 6 includes a plot of an illustrative example of a drain current plotted with respect to a gate voltage for a semiconductor device such as shown in the example of FIG. 2, as compared to a semiconductor device having a top diffusion region similar to the example of FIG. 1, such as including a linear region of conduction.

FIG. 6 includes a plot of an illustrative example 600 of a drain current 604 simulated for a semiconductor device 200, such as shown in the example of FIG. 2, plotted with respect to a gate voltage, as compared to a drain current 602 simulated for a semiconductor device having a top diffusion region similar to the example of FIG. 1. The example 600 can correspond to operating currents 602, 604 of the respective devices in a linear or triode region of conduction, and the slightly increased current 604 can correspond to a slight improvement in $R_{DSon}$, while also providing an improved BVdss as shown in the illustrative example of FIG. 5.

Figure 7:
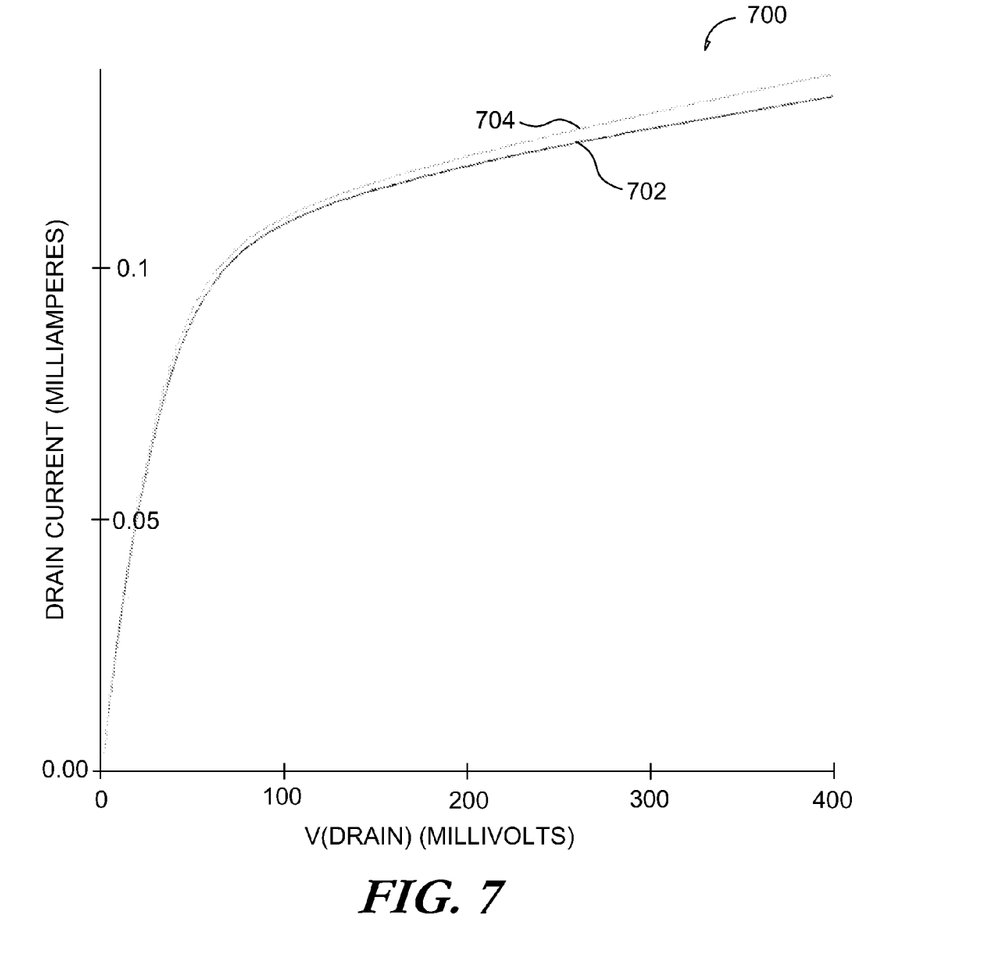
FIG. 7 includes a plot of an illustrative example of a drain current plotted with respect to a drain voltage for a semiconductor device such as shown in the example of FIG. 2, as compared to a semiconductor device having a top diffusion region similar to the example of FIG. 1, such as including a saturated mode of conduction.

FIG. 7 includes a plot of an illustrative example 700 of a drain current 704 simulated for a semiconductor device 200, such as shown in the example of FIG. 2, plotted with respect to a drain voltage, as compared to a drain current 702 of a semiconductor device having a top diffusion region similar to the example of FIG. 1. The example 700 can correspond to operating currents 702, 704 of the respective devices in a saturated mode of conduction, and the slightly increased current 704 can correspond to a slight improvement in $R_{DSon}$, while also providing an improved BVdss as shown in the illustrative example of FIG. 5.

Additional Notes

The above detailed description includes examples such as describing an NMOS-type (e.g., N-channel) semiconductor device. In an example, the p type regions and n type regions can be swapped with their opposite conductivity type counterparts (e.g., one or more n type dopants, such as boron, can be replaced with one or more corresponding p type dopants, such as phosphorous or arsenic, and vice versa), such as to provide a PMOS-type semiconductor device. The present inventor has also recognized that one or more NMOS-type or PMOS-type device can be co-integrated on a commonly-shared monolithic substrate, such as including one or more devices as described in the above detailed description. In examples referring to a metal-oxide-semiconductor (MOS) device, the gate material need not literally include metal, and can include polysilicon or one or more other conducting materials, since such "MOS" terminology can be used to generally refer to a field-effect transistor (FET) device including a conductor-insulator-semiconductor type of construction.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first,"

"second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A semiconductor device, comprising:
   a source region near a working surface of a semiconductor region;
   a drain region near the working surface and laterally offset from the source region;
   a gate located above the working surface and located laterally between the source and drain regions;
   a well region extending from the drain region laterally towards the source region, and comprising at least a portion of the active region of the semiconductor device when the semiconductor device is biased into a conducting mode; and
   a top diffusion region near the working surface within the well region and comprising:
      a center portion located laterally between the source and drain regions;
      a drain-facing portion located adjacent to the center portion on a lateral edge of the center portion facing the drain region; and
      a source-facing portion located adjacent to the center portion on a lateral edge of the center portion facing the source region, the center portion laterally wider than the source- and drain-facing portions; and
   wherein the semiconductor region and top diffusion regions include a first conductivity type, and the source, drain and well regions include a second conductivity type.

2. The semiconductor device of claim 1, wherein respective doping profiles of the central-, drain-, and source-facing portions of the top diffusion region are determined at least in part using a dopant implanted through separate respective apertures included in a mask, the mask including a central aperture aligned above a location corresponding to the center portion of the top diffusion region.

3. The semiconductor device of claim 2, wherein the respective apertures in the mask include:
   a first side aperture aligned above a location corresponding to the drain-facing portion of the top diffusion region; and
   a second side aperture aligned above a location corresponding to the source-facing portion of the top diffusion region.

4. The semiconductor device of claim 3, wherein the central aperture is laterally wider than the first and second side apertures.

5. The semiconductor device of claim 2, wherein the respective apertures in the mask include:
   a first group of side apertures above a location corresponding to a first controllably tapered profile of the top diffusion region on the lateral edge facing the drain region; and
   a second group of side apertures above a location corresponding to a second controllably tapered profile of the top diffusion region on the lateral edge facing the source region.

6. The semiconductor device of claim 5, wherein the spacing between each of the side apertures in each of the first and second groups is uniform.

7. The semiconductor device of claim 6, wherein the lateral widths of each of the side apertures included in the first and second groups of side apertures are uniform; and
   wherein the central aperture is laterally wider than each of the side apertures.

8. The semiconductor device of claim 6, wherein the lateral width of a respective side aperture is determined at least in part by the lateral distance between the respective side aperture and the central aperture.

9. The semiconductor device of claim 8, wherein the lateral width of a respective side aperture decreases as the lateral distance between the respective side aperture and the central aperture increases.

10. The semiconductor device of claim 5, wherein the spacing between respective adjacent apertures is determined at least in part by the lateral distance between the respective adjacent apertures and the central aperture.

11. The semiconductor device of claim 10, wherein the spacing between respective adjacent apertures increases as the lateral distance between the respective adjacent apertures and the central aperture increases.

12. The semiconductor device of claim 1, wherein the first conductivity type includes a p type conductivity, and the second conductivity type includes an n type conductivity.

13. The semiconductor device of claim 12, wherein the top diffusion dopant includes boron.

14. The semiconductor device of claim 12, wherein the top diffusion region is more highly doped than the semiconductor region; and
   wherein the source region includes a tap region penetrating away from the working surface to a depth greater than one or more other diffusion regions comprising the source region.

15. The semiconductor device of claim 14, wherein the tap region includes a doping profile having a first peak doping concentration;
   wherein the semiconductor region includes a doping profile having a second peak doping concentration;
   wherein the first peak doping concentration is higher than the second peak doping concentration.

16. The semiconductor device of claim 12, wherein the drain region includes a doping profile having a first peak doping concentration;
   wherein the well region includes a doping profile having a second peak doping concentration; and
   wherein the first peak doping concentration is higher than the second peak doping concentration.

17. The semiconductor device of claim 1, wherein the semiconductor region includes a semiconductor substrate.

18. The semiconductor device of claim 1, wherein a conductive material is coupled to drain region near the working surface, the conductive material extending lateral toward the gate and source regions and electrically insulated from the semiconductor region elsewhere.

19. A method, comprising:
providing a source region near a working surface of a semiconductor region;
providing a drain region near the working surface and laterally offset from the source region;
providing a gate located above the working surface and located laterally between the source and drain regions;
providing a well region extending from the drain region laterally towards the source region, and comprising at least a portion of the active region of the semiconductor device when the semiconductor device is biased into a conducting mode; and
providing a top diffusion region near the working surface within the well region, the top diffusion region comprising:
a center portion located laterally between the source and drain regions;
a drain-facing portion located adjacent to the center portion on a lateral edge of the center portion facing the drain region; and
a source-facing portion located adjacent to the center portion on a lateral edge of the center portion facing the source region;
wherein respective doping profiles of the central-, drain-, and source-facing portions of the diffusion region are determined at least in part using a dopant implanted through separate respective apertures included in a mask, the center portion laterally wider than the source- and drain-facing portions; and
wherein the semiconductor region and top diffusion regions include a first conductivity type, and the source, drain and well regions include a second conductivity type.

20. A semiconductor device, comprising:
a source region near a working surface of a semiconductor region;
a drain region near the working surface and laterally offset from the source region;
a gate located above the working surface and located laterally between the source and drain regions;
a well region extending from the drain region laterally towards the source region, and comprising at least a portion of the active region of the semiconductor device when the semiconductor device is biased into a conducting mode; and
a top diffusion region near the working surface within the well region and comprising:
a center portion located laterally between the source and drain regions;
a drain-facing portion located adjacent to the center portion on a lateral edge of the center portion facing the drain region; and
a source-facing portion located adjacent to the center portion on a lateral edge of the center portion facing the source region;
wherein respective doping profiles of the central-, drain-, and source-facing portions of the diffusion region are determined at least in part using a dopant implanted through separate respective apertures included in a mask, the center portion laterally wider than the source- and drain-facing portions; and
wherein the semiconductor region and top diffusion regions include a first conductivity type, and the source, drain and well regions include a second conductivity type.

* * * * *